United States Patent
Clements et al.

(10) Patent No.: US 8,396,000 B2
(45) Date of Patent: Mar. 12, 2013

(54) REVENUE ASSURANCES PROACTIVE TESTING METHOD AND SYSTEM

(75) Inventors: Daniel Clements, Colleyville, TX (US); Joseph Thompson, Kansas City, KS (US)

(73) Assignee: AT & T Intellectual Property I, LP, Atlanta, GA (US)

( * ) Notice: Subject to any disclaimer, the term of this patent is extended or adjusted under 35 U.S.C. 154(b) by 549 days.

(21) Appl. No.: 12/624,959

(22) Filed: Nov. 24, 2009

(65) Prior Publication Data

US 2011/0126053 A1    May 26, 2011

(51) Int. Cl.
  *G01R 31/08* (2006.01)
(52) U.S. Cl. .................. 370/250; 370/241; 379/1.01
(58) Field of Classification Search .................. 370/241, 370/250; 379/1.01
See application file for complete search history.

(56) References Cited

U.S. PATENT DOCUMENTS

| | | | | |
|---|---|---|---|---|
| 5,390,232 A * | 2/1995 | Freeman et al. | ........... | 379/10.01 |
| 5,502,653 A * | 3/1996 | Lewis | ........................... | 709/224 |
| 5,696,906 A | 12/1997 | Peters et al. | | |
| 5,751,592 A * | 5/1998 | Takai et al. | .................... | 716/106 |
| 6,091,801 A * | 7/2000 | Gulik | ......................... | 379/29.02 |
| 6,192,108 B1 * | 2/2001 | Mumford et al. | ................. | 379/9 |
| 6,842,511 B1 * | 1/2005 | Paiz | ........................ | 379/115.01 |
| 2007/0115860 A1 * | 5/2007 | Samele et al. | ................. | 370/259 |
| 2008/0275687 A1 * | 11/2008 | Matos et al. | .................... | 703/13 |

* cited by examiner

*Primary Examiner* — Jason Mattis
(74) *Attorney, Agent, or Firm* — Fay Kaplun & Marcin, LLP

(57) ABSTRACT

A computer readable storage medium stores a set of instructions executable by a processor. The set of instructions is operable to receive an image of a switch in a communications network, the image being a representation of an internal logic of the switch; simulate a plurality of communication sessions using the image; generate a plurality of simulated communication session records corresponding to the plurality of simulated communication sessions; and evaluate a performance of the switch by comparing the plurality of simulated communication session records to a set of expected communication session records, the expected set of communication set of records corresponding to the set of simulated communication sessions.

14 Claims, 3 Drawing Sheets

US 8,396,000 B2

REVENUE ASSURANCES PROACTIVE TESTING METHOD AND SYSTEM

BACKGROUND

Communications network providers need to route traffic between many users. Failure to provide proper routing may result in sub-optimal network performance. Further, failure to properly record each communication session may result in the inability to maximize revenue by properly billing users for all such sessions. Thus, providers may wish to simulate a large number of possible communication sessions in order to identify and repair such failures before, rather than after, they have occurred. Because there are a large number of possible pairs of sender and recipient in such networks, need to evaluate many simulation scenarios.

SUMMARY OF THE INVENTION

A computer readable storage medium stores a set of instructions executable by a processor. The set of instructions being operable to receive an image of a switch in a communications network, the image being a representation of an internal logic of the switch; simulate a plurality of communication sessions using the image; generate a plurality of simulated communication session records corresponding to the plurality of simulated communication sessions; and evaluate a performance of the switch by comparing the plurality of simulated communication session records to a set of expected communication session records, the expected set of communication set of records corresponding to the set of simulated communication sessions.

A system includes a memory and a processor. The processor is configured to receive an image of a switch in a communications network, the image being a representation of an internal logic of the switch; simulate a plurality of communication sessions using the image; generate a plurality of simulated communication session records corresponding to the plurality of simulated communication sessions; and evaluate a performance of the switch by comparing the plurality of simulated communication session records to a set of expected communication session records, the expected set of communication set of records corresponding to the set of simulated communication sessions.

A system includes means for receiving an image of a switch in a communications network, the image being a representation of an internal logic of the switch; means for simulating a plurality of communication sessions using the image; means for generating a plurality of simulated communication session records corresponding to the plurality of simulated communication sessions; and means for evaluating a performance of the switch by comparing the plurality of simulated communication session records to a set of expected communication session records, the expected set of communication set of records corresponding to the set of simulated communication sessions.

DETAILED DESCRIPTION

Figure 1:
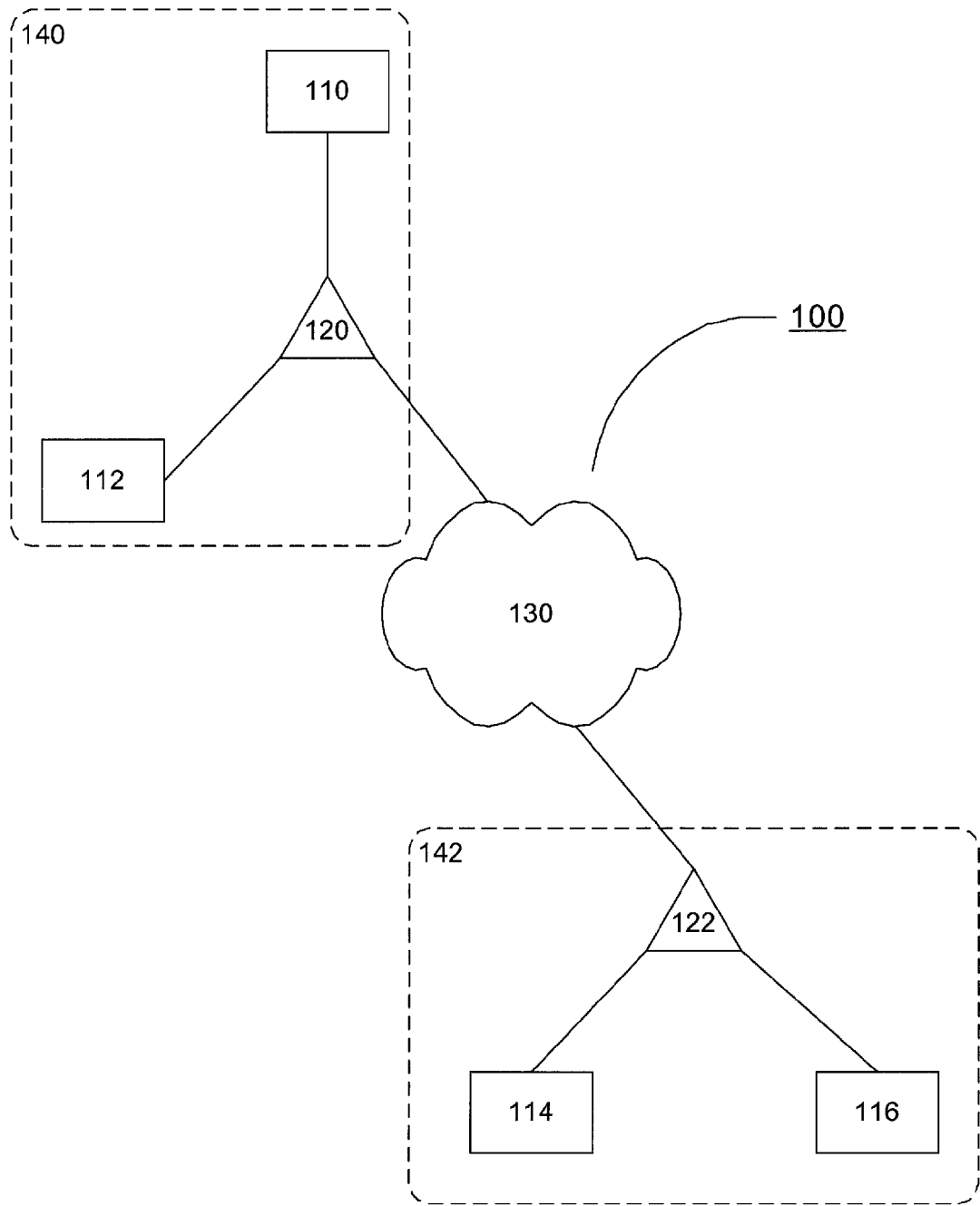
FIG. 1 shows an exemplary communications network.

The exemplary embodiments may be further understood with reference to the following description and the appended drawings, wherein like elements are referred to with the same reference numerals. The exemplary embodiments describe methods and systems for simulating large groups of communications sessions (e.g., telephone calls) in order to verify that they are being correctly completed and that records are being properly created. In the exemplary embodiments, virtual images are created of switches in a communications network, and sessions are simulated using the logic in these virtual images.

A telecommunications network (e.g., a telephone network) may comprise a large number of switches, each of which may be capable of receiving traffic originating from a number of users connected to the switch, and routing that traffic to various other points in the network. When a communications session (e.g., a telephone call) takes place, the switch that receives the initiation of the session records various information relating to the session. This information may include the identities of the initiating party and the receiving party, the billing information (e.g., a local or long-distance calling plan) of the initiating party, the length of the call, etc. Those of skill in the art will understand that proper creation of such records is essential, because users cannot be correctly billed for usage if such usage (e.g., each individual toll call placed by a user) is not recorded accurately.

If a switch is not performing properly (e.g., due to faulty hardware, incorrect software, etc.), sessions may not perform properly (e.g., a call may not connect) or records may not be properly generated. Further, while a user may notify a network provider if a session does not perform properly, there may be no such notification if a session is not being recorded and billed properly, particularly in a situation where a user is being underbilled, or not billed at all, for a session that has been completed properly. To insure that this does not occur, the network provider may wish to simulate sessions and determine whether records are being created properly. Therefore, the exemplary embodiments described herein present methods and systems for simulating large numbers of possible communications sessions.

FIG. 1 illustrates an exemplary communications network 100. Customers of the network include users 110, 112, 114 and 116. Users 110 and 112 connect to the communications network 100 via switch 120; users 114 and 116 connect via switch 122. Each of the switches 120 and 122 may then connect to the network backbone 130. Those of skill in the art will understand that the network 100 is only exemplary, and that an actual network implementation may include significantly more users, switches, etc. The users 110, 112, 114 and 116 may use differing or identical user hardware (e.g., telephones), and the switches 120 and 122 may also be identical or may differ. In this exemplary network 100, users 110 and 112 are in a first local 140 area served by switch 120; users 114 and 116 are in a second local area 142 served by switch 122. A call placed from a user to the other user in the same local area is a free call; a call placed from a user to one of the users in the other local area is a toll call.

Figure 2:
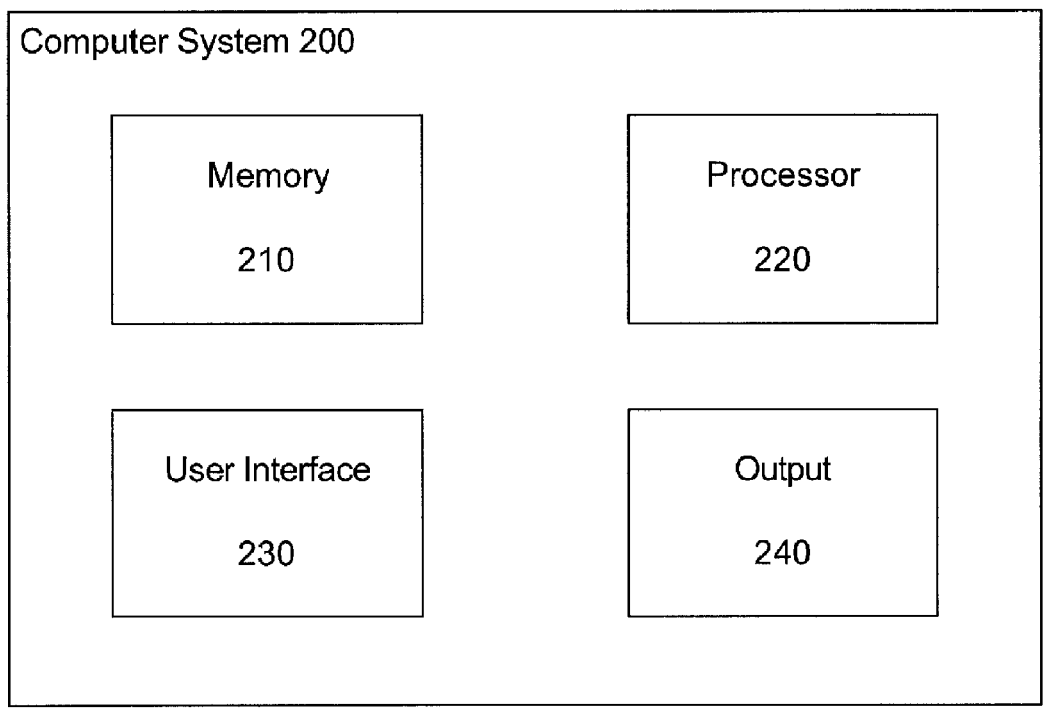
FIG. 2 shows an exemplary system for performing the exemplary method of FIG. 3.

FIG. 2 presents an exemplary system 200 for performing simulations as described above. The system 200 may perform in accordance with the exemplary method 300 of FIG. 3, as will be described below. The system 200 may include a memory 210 that may store a program containing lines of code programmed to execute a simulation as described above (e.g., the method 300). The memory 210 may be, for example, a hard drive, a CD-ROM storage, etc. The system 200 may further include a processor 220, a user interface 230, and an output 240. The processor 210 may be any of the various processors known in the art and suitable for performing the exemplary method 300. The user interface 230 may include a keyboard, a mouse, a touch-sensitive display, or any other mechanism by which a user may provide input. The output 240 may include a monitor, a printer, or any other mechanism by which intermediate or final results of the method 300 may be provided to a user. The output 240 may also display a graphical user interface prompting the user for input data and/or commands and displaying results to the user.

Figure 3:
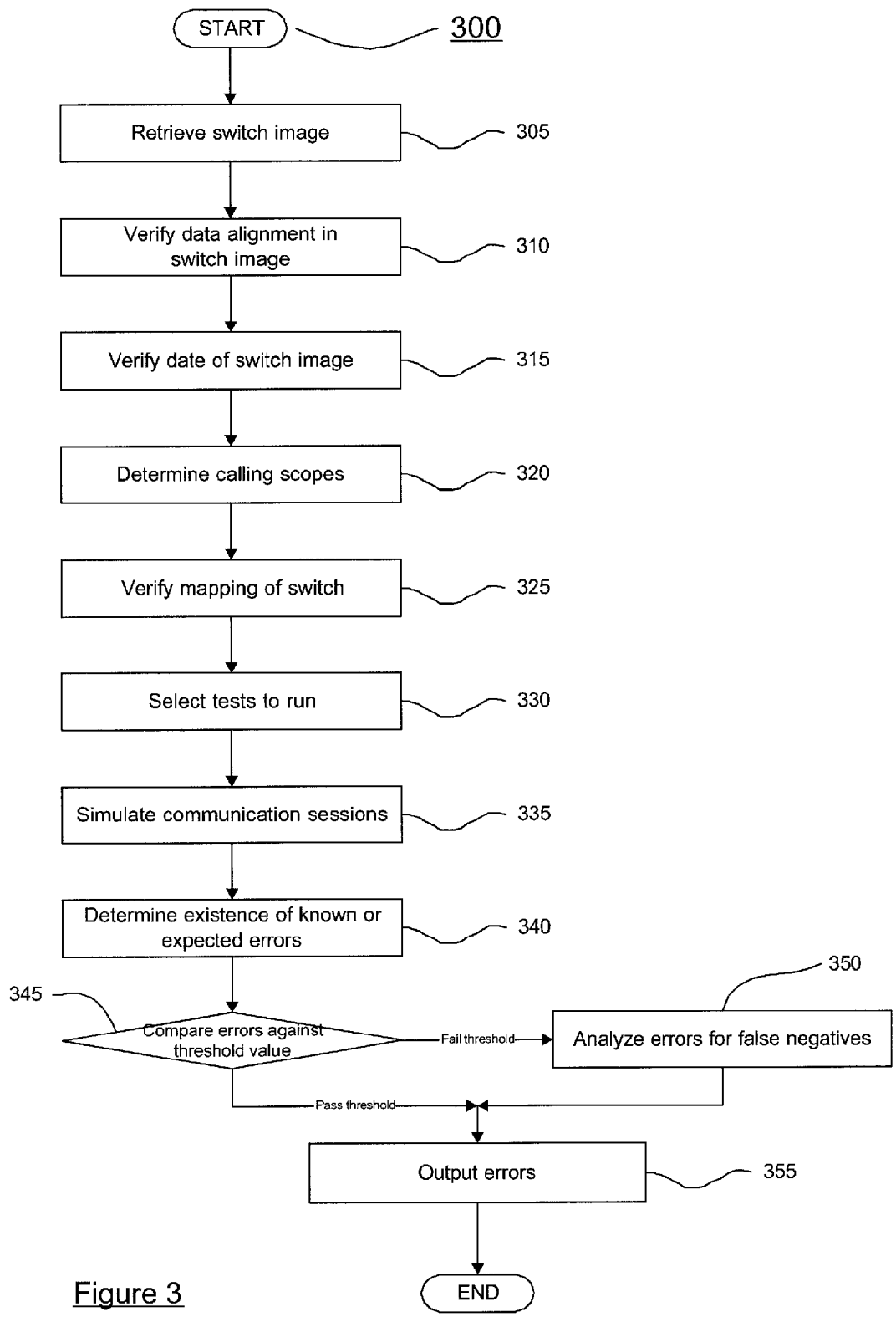
FIG. 3 shows a method according to an exemplary embodiment.

FIG. 3 presents an exemplary method 300 for performing simulations as described above. The exemplary method 300 relates to the simulation process for a single switch (e.g., switch 120) of communications network 100. Those of skill in the art will understand that the method 300 may be executed separately for each switch in order to test the integrity of an entire network, and/or may be repeated periodically for each switch in order to check for degradation of performance.

In step 305, the processor 220 retrieves an image from a selected switch (e.g., switch 120). An image may be a representation of the entirety of the internal logic of a switch, including both hardware and software. By sending a simulated communication session to the image of the switch, it may be determined how the switch would handle such a communication session, without adding any load to the switch itself. The precise manner of retrieval may depend on the parameters of the switch (e.g., regional programming, manufacturer, etc.). Further, the processor 220 may perform this step on-demand or on a predetermined schedule (e.g., if a switch or a group of switches are scheduled to be tested on a particular day, retrieval may be performed the preceding night, when network loading is lower). In some embodiments, step 305 may also include parsing and/or formatting required to make the image available and in an appropriate format for the remainder of the method 300.

In step 310, the processor 220 verifies data alignment of the switch image. As above, the precise process may vary depending on the manufacturer and model of the switch. This process is required because a misaligned switch image may cause abnormal performance of simulated communication sessions. If misaligned data is found, the processor 220 may execute code designed to align it properly; if this is not possible, the method may be restarted. Further, if multiple such failures have occurred in a short period of time, technical support personnel may be notified of such occurrences.

In step 315, the processor 220 verifies the date of the switch image. This may be accomplished by comparing the date of the image to a previously-used date to insure that a current image has been retrieved. If the date of the newly-retrieved image matches the previous date, a new image may be retrieved; if date failures occur repeatedly, technical support personnel may be notified in order to diagnose underlying issues.

In step 320, the processor 220 determines the existence of multiple calling scopes. A calling scope may relate to a rate plan available to users of the communication network. Those of skill in the art will understand that for switches handling traffic originating from groups of users with multiple calling scopes available to them, the simulation and its expected set of results should take this into account. For example, if two users, A and B, connect to the network through the same switch, but have different calling scopes such that a session connecting to a recipient C is free (e.g., a local call) for user A and billed (e.g., regional or long-distance) for user B, then the expected set of results for the simulation must take this into account.

In step 325, the processor 220 verifies the mapping of the switch. If the switch is not mapped, the processor 220 may attempt to create a map for it, and if this is not possible then a user of the system 200 is notified. The internal logic of a switch should include all of the various classes of service defined within the switch, each of which should be mapped to an externally-defined class of service. A map thus represents a control group against which the results of the simulated communication sessions will be compared. Those of skill in the art will understand that once a map is created, it will only need to be updated when a new type of service is offered to customers.

Once mapping has been verified, in step 330, the test or tests to be run are selected; this may be accomplished either by a user of the system 200, or automatically by the processor 220 in accordance with characteristics of the switch being tested. The test or tests may be selected, for example, based on the region in which the switch is located, the technology in the switch, the calling scope or scopes available to users, etc. A test may comprise a complete set of all communication sessions (e.g., phone calls) to be simulated by processing them with the switch image. Typically, this may include a simulated communication session originating from each user connecting directly to the switch, to each other user in the network.

In step 335, the processor 220 runs the test or tests selected in step 330. This may encompass sending each of the simulated communication sessions to the switch image, which makes records of the sessions in the same manner that the actual switch would do so with actual communication sessions. Because the switch image represents an image of the internal logic of the actual switch, and the actual switch will generate records when it receives actual communication sessions, the switch image will generate the same set of records as the actual switch would generate if the simulated calls were actual calls.

For example, with reference to the network 100 of FIG. 1, a test of an image of switch 120 might involve simulating six communication sessions: from user 110 to each of users 112, 114 and 116; and from user 112 to each of users 110, 114, and 116. If the switch 120 is performing properly, the communication sessions originating at each of user 110 and 112, to the other of user 110 and 112, will be recorded as a local (e.g., free) session, while the sessions originating at users 110 and 112 to users 114 and 116 will be recorded as out-of-area (e.g., toll) sessions.

In step 340, the processor 220 determines the existence of known or expected errors. Known or expected errors may occur, for example, where users of the system have been notified of a service change that has not yet taken effect. For example, if a previous test has discovered that a user or group of users is not being billed for a session that should be billed (e.g., a long-distance telephone call is being billed as a local call), the logic of the switch can be updated to bill such a session properly; however, the network operator may be required (e.g., by local laws or regulations) to notify the users about such changes before they go into effect. Therefore, if the switch and its image may not yet have been updated to reflect this change, but the expected set of records has, expected errors will be the result. Such expected errors are then removed from the list of errors, as their resolution may already be in progress.

In step 345, the processor 220 compares the portion of remaining sessions that appear to be errors to a threshold value. The threshold value may be predetermined to accomplish the goals described below. In one embodiment, this threshold value may be 95%. Thus, if 100 sessions are being considered at this stage and 3 errors are present, the results of the test may be considered to have passed a 95% threshold; if 8 errors are present, a 95% threshold has been failed. This threshold may represent an accuracy standard for the system that performs the simulation, such that performance that passes the threshold (i.e., a small number of errors) may indicate that the remaining errors are errors in the switch image (and, thus, in the switch itself), while performance that fails the threshold (i.e., a large number of errors) may indicate a flaw in the simulation process rather than in the switch.

If the errors are found to have failed the threshold value in step 345, then in step 350, the processor 220 analyzes the remaining errors for false negatives (i.e., simulated communication sessions that have been registered as errors incorrectly, although records have been made properly). False negatives thus found are first evaluated to determine whether they have a known cause, and if they do not, may then be evaluated by one or more technical support personnel to determine the root cause for why they have occurred. (Known causes for false negatives, in this case, may typically relate to complex translation issues unique to a specific switch or region that cannot be appropriately accounted for in the simulation; these conditions are usually associated with an inordinate amount of variables caused by regulatory restrictions or expectations, and may be used as opportunities to improve the simulation system.) Where possible, errors may also be repaired. Those of skill in the art will understand that this step allows for the diagnosis of errors in the simulation process, rather than in the switch itself.

Once errors have been analyzed for false negatives in step 350, or, alternately, if they have found to have passed the threshold value in step 345, the processor 220 outputs the remaining errors for further analysis in step 355. This may be accomplished using output 240, and may include on-screen display, printing to a hard copy, output into a database or spreadsheet or other such file, or any other means for providing results to a user. Those of skill in the art will understand that these remaining errors may be errors in the switch itself, or, alternately, persistent errors in the simulation system requiring further attention. These errors may subsequently be repaired using known methods that are outside the scope of the present invention.

The false negative analysis of steps 345 and 350 may ensure that errors in the simulation process may be directed to the correct technical support personnel. Thus, once these errors have been resolved, only errors that are either more difficult to resolve, or errors in the switch itself, may be directed to personnel with specialized knowledge of the simulation process or of the switches of the communication network. If the method 300 performs normally, it may execute autonomously with only a small number of errors being returned, but if it does not, errors may thus be directed to the correct technical support personnel at the correct point in the process.

Those of skill in the art will understand that the exemplary method 300 may be implemented in various manners, such as by a computer program comprising lines of code and implemented by a system such as the exemplary system 200 described above. It will be further apparent to those skilled in the art that various modifications may be made in the present invention, without departing from the spirit or the scope of the invention. Thus, it is intended that the present invention cover modifications and variations of this invention provided they come within the scope of the appended claims and their equivalents.

What is claimed is:

1. A non-transitory computer readable storage medium including a set of instructions executable by a processor, the set of instructions, when executed by the processor, causing the processor to perform a method comprising:

receiving an image of a switch in a communications network, the image being a representation of internal hardware and software of the switch;
  simulating a plurality of communication sessions using the image;
  generating a plurality of simulated communication session records corresponding to the plurality of simulated communication sessions; and
  evaluating a performance of the switch by comparing the plurality of simulated communication session records to a set of expected communication session records, the expected set of communication set of records corresponding to the set of simulated communication sessions, identifying an error group of the simulation communication records that do not match the set of expected communication records, determining a percentage of the simulated communication records that do not match the set of expected communication records, comparing the percentage to a threshold percentage, and evaluating the error group for false negatives, if the percentage is greater than the threshold percentage.

2. The non-transitory computer readable storage medium of claim 1, wherein the method further comprises:
  verifying the image.

3. The non-transitory computer readable storage medium of claim 2, wherein verifying the accuracy of the image comprises verifying a data alignment of the image.

4. The non-transitory computer readable storage medium of claim 2, wherein verifying the accuracy of the image comprises verifying a date of the image.

5. The non-transitory computer readable storage medium of claim 1, wherein the method further comprises:
  removing, from the error group, a plurality of errors that are one of known and expected to yield a modified error group,
  wherein the determining the percentage and the evaluating the error group are performed based on the modified error group.

6. The non-transitory computer readable storage medium of claim 1, wherein simulating the plurality of communication sessions comprises:
  selecting a set of communication sessions based on a location of the switch.

7. The non-transitory computer readable storage medium of claim 6, wherein the selecting is further based on a plurality of calling scopes available to users connecting to the switch.

8. A system, comprising:
  a memory storing a set of instructions; and
  a processor executing the set of instructions to perform a method comprising:
    receiving an image of a switch in a communications network, the image being a representation of internal hardware and software of the switch;
    simulating a plurality of communication sessions using the image;
    generating a plurality of simulated communication session records corresponding to the plurality of simulated communication sessions; and
    evaluating a performance of the switch by comparing the plurality of simulated communication session records to a set of expected communication session records, the expected set of communication set of records corresponding to the set of simulated communication sessions, identifying an error group of the simulation communication records that do not match the set of expected communication records, determining a percentage of the simulated communication records that do not match the set of expected communication records, comparing the percentage to a threshold percentage, and evaluating the error group for false negatives, if the percentage is greater than the threshold percentage.

9. The system of claim 8, further wherein the processor is further configured to verify the image.

10. The system of claim 9, wherein verifying the accuracy of the image comprises verifying a data alignment of the image.

11. The system of claim 9, wherein verifying the accuracy of the image comprises verifying a date of the image.

12. The system of claim 8, wherein the processor is further configured to remove, from the error group, a plurality of errors that are one of known and expected to yield a modified error group, wherein the determining the percentage and the evaluating the error group are performed based on the modified error group.

13. The system of claim 8, wherein simulating the plurality of communication sessions comprises selecting a set of communication sessions based on a location of the switch.

14. The system of claim 13, wherein the selecting is further based on a plurality of calling scopes available to users connecting to the switch.

* * * * *